US010432871B2

(12) United States Patent
Cao et al.

(10) Patent No.: US 10,432,871 B2
(45) Date of Patent: Oct. 1, 2019

(54) SYSTEMS AND METHODS FOR IMAGING USING A RANDOM LASER

(75) Inventors: Hui Cao, New Haven, CT (US); Brandon Redding, New Haven, CT (US); Michael Choma, Hamden, CT (US)

(73) Assignee: Yale University, New Haven, CT (US)

( * ) Notice: Subject to any disclaimer, the term of this patent is extended or adjusted under 35 U.S.C. 154(b) by 461 days.

(21) Appl. No.: 14/110,937

(22) PCT Filed: Apr. 16, 2012

(86) PCT No.: PCT/US2012/033807
§ 371 (c)(1),
(2), (4) Date: Dec. 23, 2013

(87) PCT Pub. No.: WO2012/142595
PCT Pub. Date: Oct. 18, 2012

(65) Prior Publication Data
US 2014/0111671 A1    Apr. 24, 2014

Related U.S. Application Data

(60) Provisional application No. 61/475,354, filed on Apr. 14, 2011, provisional application No. 61/526,480, filed on Aug. 23, 2011.

(51) Int. Cl.
*G02B 27/48* (2006.01)
*H04N 5/235* (2006.01)
(Continued)

(52) U.S. Cl.
CPC .............. *H04N 5/235* (2013.01); *G02B 27/48* (2013.01); *H01S 3/0804* (2013.01); *H01S 3/10* (2013.01);
(Continued)

(58) Field of Classification Search
CPC .............. H01S 3/20; H01S 3/30; G02B 27/48
See application file for complete search history.

(56) References Cited

U.S. PATENT DOCUMENTS 3,890,578 A  6/1975 Wang
4,790,627 A  12/1988 Lehmberg
(Continued)

FOREIGN PATENT DOCUMENTS

WO  WO 2009/154465  12/2009
WO  WO 2011/030157  3/2011

OTHER PUBLICATIONS

Rigden, et al., The Granularity of Scattered Optical Maser Light, Proceedings of the Institute of Radio Engineers 50, 2367-2368 (1962).
(Continued)

Primary Examiner — Tod T Van Roy
(74) Attorney, Agent, or Firm — McCarter & English, LLP

(57) ABSTRACT

Systems and methods are provided for imaging using complex lasers. In general, a complex laser may be used as an electromagnetic source for an imaging application. The use of a lower spatial coherence configured complex laser in imaging applications may advantageously mitigate coherent artifacts in imaging such as cross-talk and speckle and improve overall image quality. Imaging applications where a complex laser may be useful include both incoherent imaging applications, such as digital light projectors and traditional microscopy, and coherent imaging applications, such as optical coherence tomography (OCT) and holography. The systems and methods provided also enable controlling the degree of spatial coherence of a complex laser.

22 Claims, 8 Drawing Sheets

(51) Int. Cl.
*H01S 3/30* (2006.01)
*H04N 9/31* (2006.01)
*H01S 5/10* (2006.01)
*H01S 3/10* (2006.01)
*H01S 3/08* (2006.01)
*H01S 3/213* (2006.01)
*H01S 5/04* (2006.01)

(52) U.S. Cl.
CPC ............... *H01S 3/213* (2013.01); *H01S 3/30* (2013.01); *H01S 5/10* (2013.01); *H04N 9/3161* (2013.01); *H01S 5/041* (2013.01)

(56) References Cited

U.S. PATENT DOCUMENTS

| | | | |
|---|---|---|---|
| 5,956,139 | A | 9/1999 | Meyer et al. |
| 6,011,643 | A | 1/2000 | Wunderlich et al. |
| 6,656,588 | B1 * | 12/2003 | Laine .................. B82Y 30/00 423/111 |
| 7,643,155 | B2 | 1/2010 | Marks et al. |
| 7,812,303 | B2 | 10/2010 | Meyers et al. |
| 7,889,838 | B2 | 2/2011 | David et al. |
| 2003/0165174 | A1 * | 9/2003 | Lawandy ..................... 372/53 |
| 2004/0001618 | A1 * | 1/2004 | Johnson ................. G01N 15/14 382/131 |
| 2010/0128109 | A1 | 5/2010 | Banks |
| 2010/0182574 | A1 | 7/2010 | Marshall |
| 2011/0211165 | A1 * | 9/2011 | Bauco ..................... G02B 27/48 353/20 |

OTHER PUBLICATIONS

Oliver, Sparkling Spots and Random Diffraction, Proc IEEE 51, 220-221 (1963).
McKechnie, Speckle Reduction, in Topics in Applied Physics (ed. Dainty, J. C.), 9, 123-170 (SpringerVerlag, New York, NY), 1975.
Artigas, et al., Contrast Sensitivity of the Visual System in Speckle Imagery, J. Opt. Soc. Am. All, 2345-2349 (1994).
Noginov, et al.,Interferometric Studies of Coherence in a Powder Laser, Optical Materials, 12, pp. 127-134, 1999.
Zacharakis, et al., Photon Statistics of Laserlike Emission from Polymeric Scattering Gain Media, Optics Letters, vol. 25, pp. 923-925, 2000.
Cao, et al., Photon Statistics of Random Lasers with Resonant Feedback, Physical Review Letters, vol. 86,No. 20, pp. 4524-4527, 2001.
Patra, Theory for Photon Statistics of Random Lasers, Physical Review A, vol. 65,043809-1 to 043809-9, 2002.
Cao, Chapter 6: Lasing in Disordered Media, Progress in Optics (ed. Wolf, E.), vol. 45,317-370 (North-Holland, Amesterdam) 2003.
Goodman, Optical Methods for Suppressing Speckle in Speckle Phenomena in Optics,141-186 (Roberts & Company) 2007.
Gaska, et al., Laser-Speckle Properties and their Effect on Target Detection, Journal of the Society for Information Display, 15/12, 1023-1028, 2007.
Papadakis, et al., Single-Shot Temporal Coherence Measurements of Random Lasing Media, Journal of Opitcal Society, vol. 24, Opt. Soc. Am. B 31-36, 2007.
Wiersma, The Physics and Applications of Random Lasers, Nature Physics, Nature Publishing Group, vol. 4, 359-367, 2008.
Geri et al., Perceptual Assessment of Laser-Speckle Contrast, Journal of the Society for Information Display, vol. 20, 22-27, 2012.
PCT International Search Report and Written Opinion dated Sep. 17, 2012 from PCT Application No. PCT/US2012/033807 (WO 2012/142594).
Zacharakis Giannis et al., Random lasing following two-photon excitation of highly scattering gain media, Applied Physics Letters, American Institute of Physics, vol. 81, No. 14, Sep. 30, 2002, pp. 2511-2513.
European Search Report and Written Opinion for PCT/US2012/033807 dated Jul. 13, 2015.
PCT/US2012/033807, Apr. 16, 2012, WO 2012/142594.
U.S. Appl. No. 61/475,354, filed Apr. 14, 2011,
U.S. Appl. No. 61/526,480, filed Aug. 23, 2011.

* cited by examiner

SYSTEMS AND METHODS FOR IMAGING USING A RANDOM LASER

RELATED APPLICATIONS

This application is a national stage application filed under 35 USC 371 of PCT/US2012/033807, filed Apr. 16, 2012, which claims priority benefit to a commonly assigned provisional patent application entitled "Spatially incoherent random laser emission for speckle-free and cross-talk free illumination," which was filed on Apr. 14, 2011, and assigned Ser. No. 61/475,354. The present application also claims priority benefit to a commonly assigned provisional patent application entitled "Spatially incoherent random laser emission for speckle-free and cross-talk free illumination," which was filed on Aug. 23, 2011 and assigned Ser. No. 61/526,480. The entire contents of the foregoing. PCT and provisional patent applications are incorporated herein by reference.

STATEMENT OF GOVERNMENT SUPPORT

This invention was made with government support under HD001401 awarded by National Institutes of Health and under 0808937, 1068642 and 1128542 awarded by National Science Foundation. The government has certain rights in the invention.

BACKGROUND

Technical Field

The present disclosure relates to the field of imaging. More particularly, the present disclosure relates imaging using a complex laser. The present disclosure also relates to methods for adjusting spatial coherence of a complex laser.

Background Art

Many imaging applications require increasingly bright illumination sources, motivating the replacement of conventional thermal light sources with bright light emitting diodes (LEDs), superluminescent diodes (SLDs) and lasers. Despite their brightness, lasers and SLDs are poorly suited for full-field imaging applications because their higher spatial coherence leads to coherent artifacts such as speckle that corrupt image formation. See, e.g., Oliver, B. M. Sparkling spots and random diffraction, Proc IEEE 51, 220-221 (1963) and Goodman, J. W. Optical methods for suppressing speckle in Speckle phenomena in optics, 141-186 (Roberts & Company, 2007).

Lasers are indispensable light sources in modern imaging systems. Intense laser sources enable imaging through scattering or absorptive media and enable measuring dynamic behavior on short time scales. One of the signature properties of conventional lasers is high spatial coherence, a property resulting from resonant cavities with a limited number of spatial modes that produce well-defined wavefronts. A high-degree of spatial coherence has well-known advantages and disadvantages. On one hand, high spatial coherence allows for the highly directional emission of conventional lasers. On the other hand, spatial coherence leads to coherent imaging artifacts. Coherent artifacts originate from interference that occurs during image formation. The resulting intensity modulations appear as additional features that are not present in the object, thereby corrupting the image. Coherent artifacts can be introduced, for example, by aberrations in an imaging system or simply by diffraction when imaging objects with sharp edges. However, the most common manifestation of coherent artifacts is speckle, which occurs when a rough object or scattering environment introduces random phase delays among mutually coherent photons which interfere at the detector. See, e.g., Rigden, J. D. & Gordon, E. I., The granularity of scattered optical maser light, Proceedings of the Institute of Radio Engineers 50, 2367-2368 (1962). Speckle is a long-standing issue because it impairs image interpretation by a human observer. See, e.g., Geri, A. G. & Williams, L. A. Perceptual assessment of laser-speckle contrast, Journal of the Society for Information Display 20, 22-27 (2012); Gaska, J. P., Tai, C. & Geri, G. A. Laser-speckle properties and their effect on target detection Journal of the Society for Information Display 15, 1023-1028 (2007); and Artigas, J. M., Felipe, A. & Buades, M. J. Contrast sensitivity of the visual system in speckle imagery, J. Opt. Soc. Am. A 11, 2345-2349 (1994).

Over the years, various techniques have been developed to mitigate the effects of laser speckle by generating and averaging multiple uncorrelated speckle patterns (for instance, by scrambling the laser wavefront with a moving phase plate). See, e.g., McKechnie, T. S. Speckle reduction, in Topics in Applied Physics (ed. Dainty, J. C.) 9, 123-170 (Springer-Verlag, New York, N.Y., 1975). However, for M independent speckle patterns, speckle contrast (C) is reduced as $M^{-1/2}$, fundamentally limiting the signal-to-noise ratio (1/C) of a measurement to the number of speckle patterns generated (rather than the detector integration time or photon statistics). See, e.g., Goodman, J. W. Optical methods for suppressing speckle in Speckle phenomena in optics, 141-186 (Roberts & Company, 2007). Hence, there is considerable interest in developing laser sources that fundamentally preclude the formation of coherent artifacts—that is, a laser with lower spatial coherence.

Imaging without coherent artifacts requires illumination of a sample with a large number of mutually incoherent photons. The number of photons per coherence volume (i.e. the photon degeneracy parameter) is therefore a relevant measure of source power since photons from distinct coherence volumes cannot interfere to generate coherent artifacts. From this perspective, the limitations of thermal sources and conventional lasers are clear. On one hand, thermal sources generate coherent artifact-free images (lower spatial coherence), but have very few photons per coherence volume (low photon degeneracy). On the other hand, conventional lasers have many photons per coherence volume (high photon degeneracy) but readily generate coherent artifacts (high spatial coherence). Thus, there is a need for sources with higher photon degeneracy and lower spatial coherence. This field relating to random lasers is relatively young and as such does not have many realized applications. To date, random lasers have not been adopted or applied in an imaging context.

Complex lasers support multiple spatial modes, either localized and/or extended. Examples of complex lasers include random lasers, partially ordered lasers, and chaotic cavity lasers. As described herein, complex laser may advantageously be designed with phase fronts that combine to produce emission with low or partial spatial coherence. This field relating to random lasers is relatively young and as such does not have many realized applications. To date, complex lasers have not been adopted or applied in an imaging context.

Random lasers are complex lasers in that they are made from disordered materials that trap light via multiple scattering. See, e.g., Cao, H. Lasing in Disordered Media, in Progress in Optics (ed. Wolf, E.) 45, 317-370 (North-Holland, Amesterdam, 2003) and D. S. Wierma, The physics and applications of random lasers, Nat. Phys. 4, 359-367 (2008). The spatial modes are inhomogeneous and highly irregular. With external pumping, a large number of modes can lase simultaneously with uncorrelated phases. Their distinctly structured wavefronts combine to produce emission with relatively low spatial coherence. Over the past two decades, random lasers have been the subject of intense theoretical and experimental studies. Id. Coherence is a fundamental characteristic of any laser, and, as such, the temporal coherence and second-order coherence of random lasers have been thoroughly investigated. See, e.g., V. M. Papadakis, A. Stassinopoulos, D. Anglos, S. H. Anastasiadis, E. P. Giannelis, and D. G. Papazoglou, J. Opt. Soc. Am. B 24, 31 (2007); M. A. Noginov, S. U. Egarievwe, N. Noginova, H. J. Caulfield, and J. C. Wang, Opt. Mat. 12, 127 (1999); H. Cao, Y. Ling, J. Y. Xu, C. Q. Cao, and P. Kumar, Phys. Rev. Lett. 86, 4524 (2001); G. Zacharakis, N. A. Papadogiannis, G. Filippidis, and T. G. Papazoglou, Opt. Lett. 25, 923 (2000); and M. Patra, Phys. Rev. A 65, 043809 (2002). Spatial coherence of random laser emission, however, is not well understood despite initial observations indicating that it is much lower than in a conventional laser.

SUMMARY

In exemplary embodiments, an active interrogation imaging system is provided, the system including a complex laser for generating electromagnetic radiation for interrogating an object and one or more detectors for detecting an image of the object. The generated electromagnetic radiation may advantageously exhibit a degree of spatial coherence, e.g., sufficiently low to mitigate coherent artifacts such as crosstalk and speckle in the detected image. In some embodiments the complex laser may be configured based on a pre-selected degree of spatial coherence such that generated electromagnetic radiation exhibits the pre-selected degree of spatial coherence. In other embodiments, the complex laser may be adapted to be reconfigured so as to enable adjusting the generated electromagnetic radiation's degree of spatial coherence. In some embodiments, the complex laser may be adapted to enable adjusting an excitation volume of an excitation medium, e.g., by adjusting a spot size of an excitation source on an excitation medium and/or by adjusting a size of an electrode excitation region of an excitation medium. In other embodiments, the complex laser may be adapted to enable adjusting a mean free path for photons in an excitation medium, e.g., by adjusting concentration, size, shape and/or placement of scattering elements in an excitation medium and/or by adjusting a refractive index (e.g., adjusting permeability and/or permativity) of a background material in an excitation medium and/or scattering elements in an excitation medium. The complex laser may be a random laser. Alternatively, the complex laser may be a chaotic cavity laser, e.g., adapted to enable adjusting a degree of cavity chaoticity such as by adjusting a shape of the cavity. The imaging system may be an incoherent imaging system, e.g., a projector or microscopy system, or a coherent imaging system, e.g., an optical coherence tomography system or a holography system. In some embodiments, the imaging system may be a ranging imaging system. In exemplary embodiments, the complex laser may enables illumination with varying degrees of spatial coherence. Thus, the imaging system may be configured to capture images for both higher spatial coherence illumination and lower spatial coherence illumination. The imaging system may process and compare the images captured for higher coherence and lower coherence illumination, e.g., to determine sectioning and/or segmentation information for the sample. Alternatively, the imaging system may process the images captured for higher coherence and lower coherence illumination for different types of information. For example, the imaging system may process images captured for higher spatial coherence illumination to determine scattering properties of a sample and/or motion characteristics of a sample, e.g., flow, shear, velocity, etc. The imaging system may also process images captured for lower spatial coherence illumination to determine sample structure. Determined information may be combined, e.g., to produce maps of scattering properties of the sample or maps of motion in the sample.

In further exemplary embodiments, a complex laser with tunable spatial coherence is provided, the complex laser including an excitation medium and an excitation source for pumping the excitation medium, wherein the complex laser is adapted to be reconfigured so as to enable adjusting spatial coherence of electromagnetic radiation generated by the complex laser. In some embodiments, wherein the complex laser may be adapted to enable adjusting an excitation volume of the excitation medium, e.g., by adjusting a spot size of the excitation source on the excitation medium and/or by adjusting an electrode excitation region of the excitation medium. In other embodiments, the complex laser may be adapted to enable adjusting a mean free path for photons in the excitation medium, e.g., by adjusting concentration, size, shape and/or placement of scattering elements in the excitation medium and/or by adjusting a refractive index (e.g., adjusting permeability and/or permittivity) of a background material in the excitation medium and/or scattering elements in the excitation medium. The complex laser may be a random laser. Alternatively, the complex laser may be a chaotic cavity laser, e.g., adapted to enable adjusting a degree of cavity chaoticity such as by adjusting a shape of the cavity.

In further exemplary embodiments, a method is provided for controlling spatial coherence of electromagnetic radiation generated by a complex laser, the method including reconfiguring the complex laser by (i) adjusting an excitation volume of an excitation medium, e.g., by adjusting the excitation volume includes adjusting a pump spot size of an excitation source on the excitation medium and/or by adjusting the excitation volume includes adjusting a size of an electrode excitation region of the excitation medium, and/or (ii) adjusting a mean free path for photons in an excitation medium, e.g., by adjusting concentration, size, shape and/or placement of scattering elements in the excitation medium and/or by adjusting a refractive index (e.g., adjusting permeability and/or permativity) of a background material in the excitation medium and/or scattering elements in the excitation medium. The complex laser may be a random laser. Alternatively, the complex laser may be a chaotic cavity laser, e.g., wherein the reconfiguring the chaotic cavity laser includes adjusting a degree of cavity chaoticity such as by adjusting a shape of the cavity.

In further exemplary embodiments, a method is provided for controlling spatial coherence of electromagnetic radiation generated by a chaotic cavity laser, the method including reconfiguring the chaotic cavity laser by adjusting a degree of cavity chaoticity, e.g., by adjusting the chaoticity may include adjusting a shape of the cavity.

In further exemplary embodiments, a method is provided for configuring a complex laser, the method including pre-selecting a degree of spatial coherence and configuring the complex laser such that electromagnetic radiation generated by the random laser exhibits the pre-selected degree of spatial coherence. Configuring the complex laser may include, e.g., adjusting an excitation volume of an excitation medium and/or adjusting a mean free path for photons in an excitation medium. In some embodiments, the pre-selected degree of spatial coherence may be a range of acceptable values. In exemplary embodiments, the complex laser may be configured based on a pre-established mutual coherence function. In some embodiments, the pre-selected degree of spatial coherence may be determined by a maximum area of coherence, e.g., wherein the maximum area of coherence is determined based on a resolution of an imaging application. The complex laser may be a random laser. Alternatively, the complex lase may be a chaotic cavity laser, e.g., wherein configuring the chaotic cavity laser includes adjusting a degree of chaoticity.

In further exemplary embodiments, a method is presented for imaging using a complex laser the method including configuring the complex laser for imaging using illumination with a first degree of spatial coherence, imaging an object using the illumination with the first degree of spatial coherence, reconfiguring the complex laser for imaging using illumination with a second degree of spatial coherence and reimaging the object using the illumination with the second degree of spatial coherence. In some embodiments, the first degree of spatial coherence may be a higher degree of spatial coherence and the second degree of spatial coherence may be a lower degree of spatial coherence. In some embodiments, images captured for higher coherence and lower coherence illumination may be compared, e.g. to determine sectioning and/or segmentation information for the sample. Alternatively, images captured for higher coherence and lower coherence illumination may be separately processed for different types of information. For example, images captured for higher spatial coherence illumination maybe processed, e.g., to determine scattering properties of a sample and/or motion characteristics of a sample, e.g., flow, shear, velocity, etc., and images captured for lower spatial coherence illumination may be processed to determine sample structure. Determined information may be combined, e.g., to produce maps of scattering properties of the sample or maps of motion in the sample.

Additional features, functions and benefits of the disclosed systems and methods will be apparent from the description which follows, particularly when read in conjunction with the appended figures.

BRIEF DESCRIPTION OF THE DRAWINGS

To assist those of ordinary skill in the art in making and using the disclosed apparatus, systems and methods, reference is made to the appended figures, wherein.

DESCRIPTION OF EXEMPLARY EMBODIMENT(S)

Figure 1:
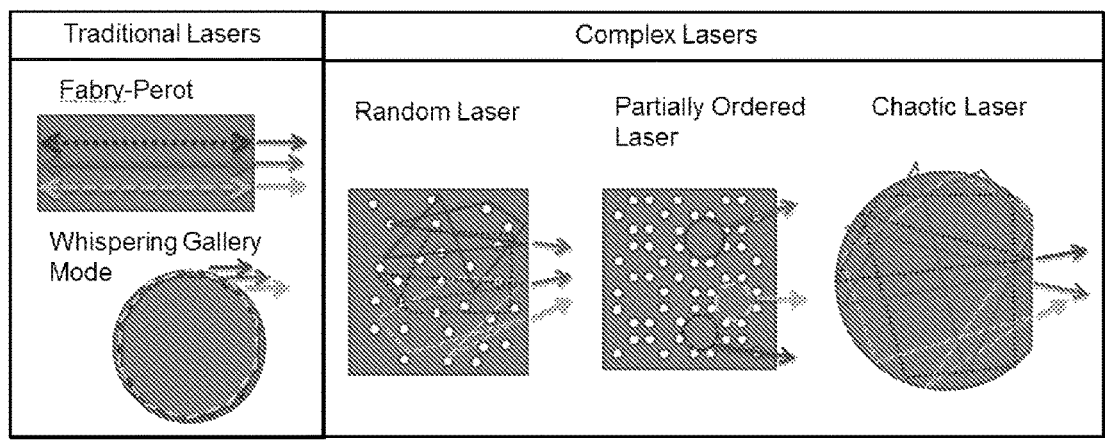
FIG. 1 depicts a comparison of exemplary architectures of conventional and complex lasers.

According to the present disclosure, advantageous systems and methods are provided for imaging using complex lasers. In general, a complex laser may by used as an electromagnetic source for an imaging application (e.g., visible light, ultraviolet radiation, near infrared radiation, infrared radiation, microwaves, x-rays, etc.). The use of a lower spatial coherence configured complex laser in imaging applications may advantageously mitigate coherent artifacts in imaging such as cross-talk and speckle and improve overall image quality. Exemplary imaging applications where a complex laser may be useful include both incoherent imaging applications, such as digital light projectors and traditional microscopy, and coherent imaging applications, such as optical coherence tomography (OCT) and holography. A complex laser may also be applied to coherent ranging applications. As demonstrated herein, a lower spatial coherence configured complex laser may be particularly useful for imaging applications involving imaging through a scattering medium.

In exemplary embodiments, the disclosed systems and methods enable controlling the degree of spatial coherence of a complex laser. In some embodiments, the systems and methods enable controlling the degree of spatial coherence of a complex laser based on the excitation volume, e.g., as related to excitation source spot size, and/or the mean free path between scattering elements, e.g., as related to the concentration of scattering elements in the excitation medium. Thus, in exemplary embodiments, the excitation volume and/or the mean free path of the scattering elements may be configured to produce an optimal or desired degree of spatial coherence, e.g., for a given imaging application.

In exemplary embodiments, the systems and methods enable controlling the degree of spatial coherence of a chaotic cavity laser based on the degree of chaos (chaoticity) of the cavity, e.g., as measured by the mean Lyapunov exponent and related to the cavity design (e.g., chaoticity may be controlled by varying characteristics of the cavity such as the shape of the cavity and/or by varying characteristics of scattering elements inside the cavity such as scattering element concentration, placement, size, shape, etc.). Thus, in exemplary embodiments, the chaoticity of the cavity may be configured to produce an optimal or desired degree of spatial coherence, e.g., for a given imaging application. It is noted that various imaging applications may work best with an intermediate degree of spatial coherence.

In exemplary embodiments, systems and methods may utilize a complex laser with tunable spatial coherence, e.g., wherein the excitation volume and/or the mean free path between scattering elements may be adjusted to actively control the degree of spatial coherence. In some embodiments systems and methods may utilize a chaotic cavity laser with tunable spatial coherence, e.g., wherein the chaoticity of the cavity may be adjusted to actively control the degree of spatial coherence.

"Complex lasers," as used herein, may be defined as "lasers which supports multiple spatial modes, either localized and/or extended. Examples of complex lasers include random lasers, partially ordered lasers, and chaotic cavity lasers. As described herein, complex laser may advantageously be designed with phase fronts that combine to produce emission with low or partial spatial coherence.

"Excitation volume," as used herein refers to the volume of the excitation medium (also known as the gain medium) of the laser which is pumped. As would be understood by one of ordinary skill in the art, in embodiments involving excitation by an excitation source such as the Nd:YAG pump laser of FIG. 2, the excitation volume may correlate to the spot size of the excitation source. Thus, in exemplary embodiments, the excitation volume may be adjusted by controlling, e.g., using optics, the spot size of the excitation source. It will be appreciated, however, that controlling the spot size is only one way of adjusting the excitation volume. For example, in other embodiments, the excitation volume may be adjusted by changing the size of the electrode in the case of electrical excitation, or by changing the actual volume of gain material.

"Mean free path," as used herein refers to either the scattering mean free path or the transport mean free path of an electromagnetic wave/particle in the excitation volume. Conceptually, the scattering mean free path may be thought of as the average distance covered by a wave/photon between collisions with scattering elements and the transport mean free path may be though of as the average distance covered by a wave/photon before its direction of propagation is randomized (this may be related to the directionality of the scattering). As would be appreciated by one of ordinary skill in the art, the mean free path of a photon in the excitation volume is related to the concentration of the scattering elements in the excitation volume. Thus, in exemplary embodiments, the mean free path may be adjusted by controlling the concentration of the scattering elements. It will be appreciated, however, that controlling the concentration of the scattering elements is only one way of adjusting the mean free path. For example, in other embodiments, the mean free path may be adjusted by changing the size, shape, or placement (orientation and/or spatial distribution) of the scattering elements or by using scattering elements and/or a background material with a different refractive index (e.g., a different permeability and/or permittivity). In some embodiments, the mean free path may be adjusted by controlling the directionality of scattering by excitation medium, e.g., by the scattering elements.

"Chaoticity" as used herein refers to the degree of chaos of the cavity. Consider two rays propagating in a cavity. If the position or direction of one of these rays is perturbed, their paths will diverge as they travel around the cavity. In a chaotic cavity, the paths followed by the two rays will diverge exponentially. The degree of divergence may be measured by the Lyapunov exponent. As would be appreciated by one of ordinary skill in the art, chaoticity may be related to characteristics of the cavity such as the shape of the cavity and/or to characteristics of any scattering elements inside the cavity such as scattering element concentration, placement, size, shape, etc.

FIG. 1, compares architectures of a conventional lasers (a) and (b) to those of complex lasers (c), (d) and (e). In conventional lasers (a) and (b), an excitation medium is pumped using an excitation source. Electro magnetic radiation is constrained within an optical cavity, e.g., within a Fabry-Pérot interferometer as in (a) or within a whispering gallery as in (b), enabling optical amplification. Conventional lasers (a) and (b) support only spatial modes with a generally regular spatial profile and uniform wavefront.

Complex laser (c) is a random laser. In contrast with a conventional laser, the excitation medium is highly disordered and there is no explicitly designed optical cavity. Rather, a concentration of scattering elements, constrain the electromagnetic radiation and act as the optical cavity enabling optical amplification based on stimulated emission. As in a conventional laser, if the gain is greater than the losses (via spontaneous emission), the lasing threshold will be broken and lasing can occur. Complex laser (d) is a partially ordered laser. A partially ordered laser is similar to a random laser in that there is no explicitly designed optical cavity. The excitation medium, however, is partially ordered, i.e., based on an ordered distribution of scattering elements which constrain the electromagnetic radiation and act as the optical cavity enabling optical amplification based on stimulated emission. As described herein, a degree of spatial coherence of a random laser or of a partially ordered laser may be controlled based on the excitation volume of the laser and/or the mean free path between scattering elements. An exemplary dye random laser is described herein with respect to FIG. 2. The present disclosure is not however, limited to dye random lasers. Indeed, other types of random lasers may be used in the systems and methods presented herein. For example, a semiconductor random laser may be used, wherein a semiconductor material forms the excitation medium and air pockets and/or other refractive variations in the semiconductor material form the scattering elements.

Complex laser (e) is a chaotic cavity laser. In a chaotic cavity laser, the optical ray dynamics are chaotic due to the irregular shape of the cavity and/or the presence of scattering elements distributed, e.g., randomly, inside the cavity. A typical chaotic cavity may have one or a few openings, but waves/photons are trapped inside the cavity long enough to ergodically explore the entire cavity volume. Chaoticity of a cavity may be described/measured using the Lyapunov exponent. Chaoticity of the cavity will affect the spatial profile and wavefront of the cavity modes. Lasing is induced by introducing optical gain into the chaotic cavity. Because the chaotic cavity lasing modes will have distinct spatial profile with unique wavefronts, the combined emission can exhibit lower spatial coherence. Chaoticity may be controlled by varying characteristics of the cavity such as the shape of the cavity and/or to characteristics of any scattering elements inside the cavity such as scattering element concentration, placement, size, shape, etc. By controlling chaoticity, the number of spatial modes that have distinct wavefronts may be varied thus affecting the spatial coherence of laser emission from the chaotic cavity.

In a chaotic cavity laser, as in other complex lasers, spatial coherence may also be controlled by adjusting the excitation volume. This could be accomplished, e.g., by either optically pumping a local region within the chaotic cavity or by fabricating the cavity with multiple electrodes which can be controlled separately, thereby selectively pumping different sections of the cavity. In either case, the local excitation will affect the gain distribution in the cavity, providing active control of the number and type of lasing modes excited and thus the spatial coherence of the chaotic cavity laser."

Demonstrating Controlled Spatial Coherence of a Random Laser:

As noted above, the subject application is the first to disclose an ability to control the spatial coherence of a complex laser, e.g., based on the excitation volume of the random laser and/or the mean free path between scattering elements in the excitation volume. To illustrate such ability, a systematic, experimental investigation of the spatial coherence of random laser emission was conducted. Specifically, the effect on spatial coherence of the concentration of scattering elements and excitation volume was investigated. Based on the results of the empirical study, as described herein, regimes of operation are identified herein, wherein a random laser provides substantially spatially incoherent emission. Moreover, the correlations noted herein may be used to tune/configure a random laser to exhibit a desired/selected degree of spatial coherence. Random lasers so tuned/configured may be used to mitigate coherent artifacts in numerous imaging applications such as those applications elaborated on herein.

Tests were conducted using a series of excitation medium samples each including a laser dye solution and polystyrene spheres. The laser dye solution included 5 mMol of Rhodamine 640 dissolved in diethylene glycol (DEG). The polystyrene spheres were each ~240 nm in diameter and their scattering cross section in DEG, $\sigma$, was calculated to be $1.67\times10^{-11}$ cm$^2$. Different polystyrene sphere concentrations were used ($\rho$, of $1.2\times10^{12}$ cm$^{-3}$, $6.1\times10^{12}$ cm$^{-3}$, and $1.2\times10^{13}$ cm$^{-3}$) to demonstrate the effect of the mean free path on spatial coherence. Since the average distance of adjacent spheres was much larger than the diameter of the scattering cross section, light scattering by individual spheres was independent, and the scattering mean free path was estimated by $l_s(\rho\sigma)^{-1}$ to be 500 µm, 100 µm, and 50 µm, respectively.

Figure 2:
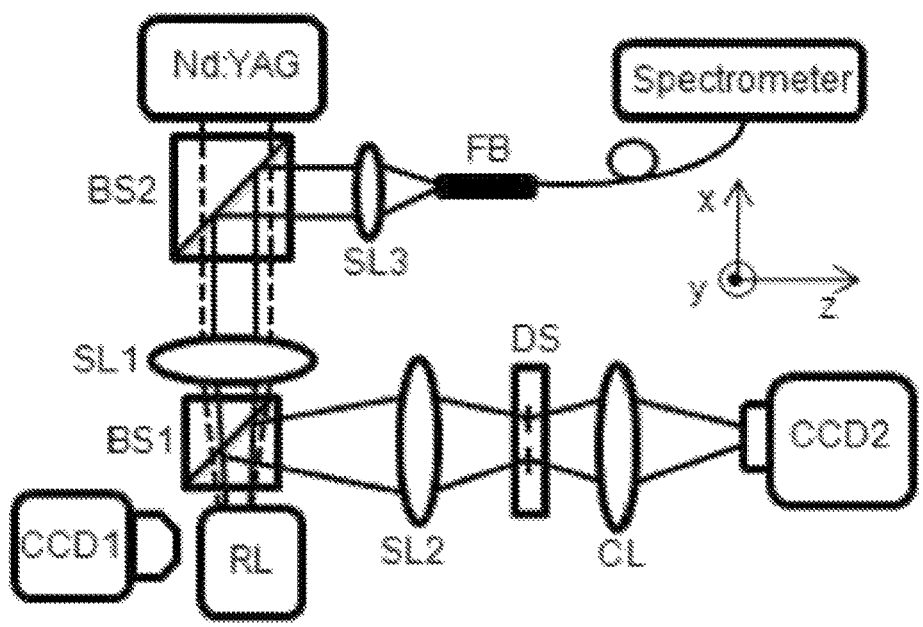
FIG. 2 depicts an exemplary random laser system used to empirically study the effect of pump laser spot size and mean free path on spatial coherence.

As depicted in FIG. 2, lasing was achieved by optically exciting the different excitations mediums with a frequency-doubled laser Nd:YAG (wavelength $\lambda$=532 nm) with 30 ps pulses at a repetition rate of 10 Hz. The pump beam was focused via a first spherical lens SL1 onto the excitation medium through the front window of a cuvette RL housing the excitation medium and the spot size of the laser on the excitation medium was monitored using a charge-coupled-device (CCD) camera CCD1 through the side window of the cuvette RL. The cuvette RL was rotated ~10° with respect to the pump beam to avoid feedback from the front window affecting the lasing modes. See, e.g., P. C. deOliveira, J. A. McGreevy, and N. M. Lawandy, Opt. Lett. 22, 895 (1997). The excitation volume was controlled by focusing the pump beam and moving the excitation medium (contained in the cuvette RL) in and out of the focal point of the first spherical lens SL1.

In order to characterize the spatial coherence of the emission from the tested excitation mediums, a technique based on a Young's double slit experiment was utilized. See, e.g., M. A. Noginov, S. U. Egarievwe, N. Noginova, H. J. Caulfield, and J. C. Wang, Opt. Mat. 12, 127 (1999). The random laser emission exiting the front window of the cuvette RL (in the direction of the pump laser) was partially re-directed using a beam splitter BS1. A second spherical lens SL2 imaged the random laser emission onto a screen DS with two slits forming an image of the emission spot. The slits were 150 µm wide and separated by 750 µm. Behind the double slit, a second (CCD) camera CCD2 was positioned at the back focal plane of a cylindrical lens CL, oriented parallel to the slits, to measure the far-field interference pattern. The visibility of the interference pattern provided a measure of the coherence between pairs of points on the emission spot with a spatial separation equal to the double slit separation divided by the magnification of our imaging optics. Unless otherwise noted, a magnification of 6 was used, thereby probing the spatial coherence between pairs of points separated by 125 µm. The resolution of the second camera CCD2 was ~15 µm which was significantly smaller than the double slit separation.

Figure 3:
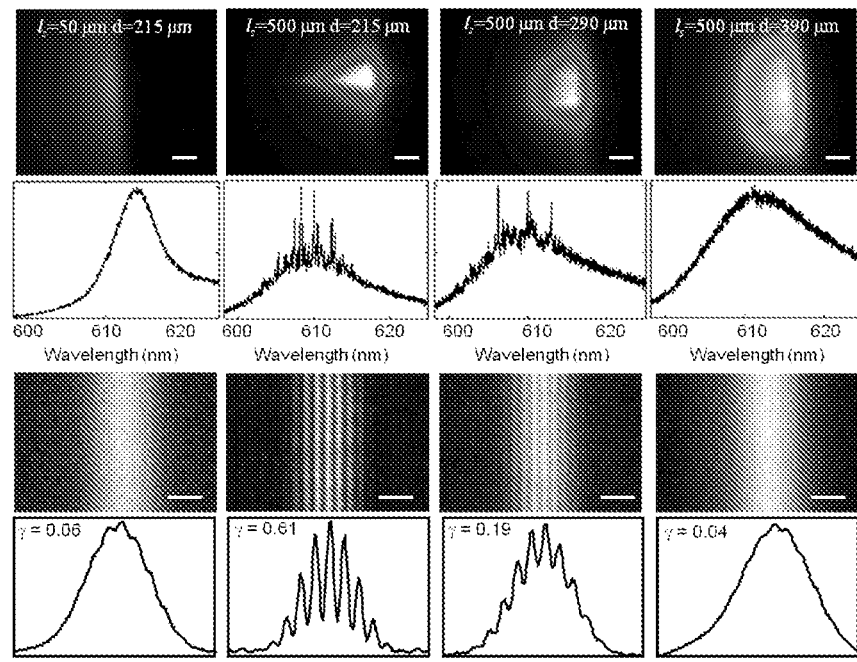
FIG. 3 depicts results for an empirical study of the effect of pump laser spot size and mean free path on spatial coherence.

Various combinations of the different excitation mediums (with different free mean paths) and different pump spot sizes (representing different excitation volumes) were tested. FIG. 3, depicts the results of the investigation. More particularly, top row of FIG. 3 depicts side-view images of excitation volume using the first camera CCD1. The scattering mean free path of the sample ls and the spot diameter d corresponding to each column are indicated and the scale bar is 100 µm. The second row of FIG. 3 depicts single shot emission spectra taken at 2× lasing threshold for each of the tested configurations using the second camera CCD2. The third row of FIG. 3 depicts interference fringes from the double slit as imaged using the second camera CCD2. Finally, the fourth row of FIG. 3 depicts interference intensity averaged along the slits (y-axis). The magnification in all measurements was set to 6, thereby providing a measure of the coherence at a spatial distance of ~125 µm.

The spatial coherence of a weakly scattering excitation medium ($l_s$=500 µm) excited with a 215 µm diameter pump spot was tested first. Data corresponding to this configuration is presented in the second column of FIG. 3. The single-shot emission spectra included narrow lasing peaks on top of a broad-band amplified spontaneous emission (ASE). The interference fringe image is shown in the third row. The envelope of the interference fringes was dictated by the slit width, so our discussion will focus on the visibility of the center fringe. The high contrast fringes at the center of the envelope implied a higher spatial coherence, which had not been observed before in a random laser. What was more surprising was that the fringes appeared in uniform vertical lines (parallel to the slits), and their position did not shift between pump pulses. This indicated that every pair of emission points imaged onto the two slits had the same phase difference, even for different pulses.

To confirm that the uniformity of the fringes was not an experimental artifact, the interference pattern generated by a spatially coherent He:Ne laser ($\lambda$=632.8 nm, close to the random laser emission wavelength) scattered off the polystyrene spheres in the same sample was measured. In this case, the phase of the scattered He:Ne laser light was scrambled and rows of interference fringes were observed, each with a random offset from the center of the two slits, similar to those presented in M. A. Noginov, S. U. Egarievwe, N. Noginova, H. J. Caulfield, and J. C. Wang, Opt. Mat. 12, 127 (1999). Because the phase difference between pairs of points incident on the double slit changed along the length of the slit, the fringes for different pairs of points appeared with varying offsets from the optical axis between the slits.

After eliminating the possibility of any artifact, the spatial coherence experiment was repeated using a sample of Rhodamine 640 in DEG without polystyrene spheres. In this sample only ASE was observed, as no scattering elements were present to provide feedback for lasing. See, e.g., X. Wu and H. Cao, Opt. Lett. 32, 3089 (2007). When exciting with a similar-size pump spot, vertical fringes with high contrast were again observed. To explain this observation, note that the excitation volume, imaged from the side, had a cone shape whose length was larger than the width. ASE was the strongest along the longest dimension of the gain volume because spontaneously emitted photons propagating in this direction experienced the most amplification. Since the excitation pulse was much shorter than the radiative decay lifetime of Rhodamine 640 molecules, most of the emission can be attributed to ASE originating from a few spontaneous emission events which were amplified along the axis of the excitation cone. As a result, the ASE leaving the front window of the cuvette had a uniform phase front, and generated vertical fringes. This behavior was similar to that of a superluminescent diode (SLD) which is known to exhibit high spatial coherence. See, e.g., N. Negi, H. Yamamoto, Y. Hayasaki, and N. Nishida, in Proc. SPIE 4416, 384 (2001).

This observation of spatially coherent ASE provided a clue for understanding the spatial coherence of laser emission from the weakly scattering sample depicted in the second column of FIG. 3. Although the emission from the weakly scattering sample included both random lasing and ASE, the spatial coherence was nearly identical to the sample without spheres. Therefore, the random lasing component of the emission exhibited similar spatial coherence to the ASE component. To explain the higher spatial coherence of the lasing component, note that the scattering mean free path, $l_s$, was longer than the absorption length, $l_a$, of pump light, and the excitation volume had an elongated, conical shape similar to the sample without spheres. The random lasing modes tend to orient themselves along the longest dimension of the gain volume. This mode orientation, combined with the weak scattering, allowed most of the lasing emission to leave the front cuvette window with a uniform phase front. Consequently, the interference fringes generated by each mode appeared at the same position.

Spatial coherence was observed to decrease as the pump area (excitation volume) was increased. See e.g., the third and fourth columns of FIG. 3 testing the weakly scattering excitation medium ($l_s$=500 μm) excited with larger diameter pump spots (290 μm and 390 μm, respectively). As the pump spot diameter d increased, the width of the excitation cone became comparable to the depth. See, e.g., the first row of FIG. 3. Light amplification along the cone axis was no longer stronger than in other directions. Thus, as the lasing modes reoriented themselves, the laser emission collected through the front cuvette window no longer exhibited a constant phase front. It was also observed that more modes were excited as the excitation volume was increased and eventually the peaks were so close to each other that they could no longer be resolved spectrally. See, e.g., the second and third rows of FIG. 3. The presence of a large number of lasing modes with uncorrelated phase relationships reduced the spatial coherence of the laser emission. See, e.g., the last row of FIG. 3.

Spatial coherence was also observed to decrease as the concentration of the spheres was increased (note that the concentration of the spheres is inversely related to the mean free path). The first column of FIG. 3 depicts results for an excitation medium configuration with $l_s$=50 μm and d=215 μm (note that d is the same as for the configuration in the second column of FIG. 3). As $l_s$ became smaller than $l_a$, the excitation volume changed from an elongated cone to a hemisphere. See, e.g., the first row of FIG. 3. Meanwhile the number of lasing peaks increased for the same pump size because the stronger scattering reduced the effective volume of individual lasing modes. See, e.g., the second row of FIG. 3. For the smallest pump spot size considered, there were already so many lasing peaks that they merged to form a continuous band in the emission spectra. See, e.g., the third row of FIG. 3. Since the excitation volume was approximately hemispherical, there were no preferred directions for amplification and very low spatial coherence was observed. See, e.g., the fourth row of FIG. 3.

To quantitatively describe the degree of spatial coherence, the mutual coherence function, γ was computed from the interference fringe data. The degree of coherence between two fields, $E_1$ and $E_2$, is defined as $\gamma = \langle E_1 E_2^* \rangle / \sqrt{I_1 I_2}$, where $I_1 = |E_1|^2$, and $I_2 = |E_2|^2$. Note that in experiments conducted, the intensity on the two slits was equal and γ reduced to the visibility: $\gamma = (I_{max} - I_{min})/(I_{max} + I_{min})$, where $I_{max}$ and $I_{min}$ are the maximum and minimum intensities of the interference fringes.

Figure 4:
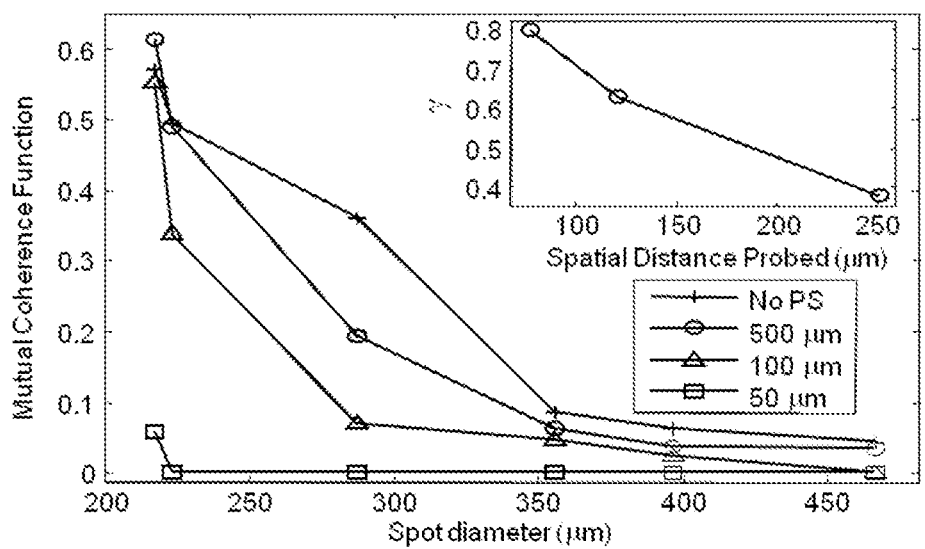
FIG. 4 depicts mutual coherence functions computed based on an empirical study of the effect of pulse laser spot size and mean free path on spatial coherence.

FIG. 4 depicts γ computed from measurements using four different sphere concentrations (including no spheres) and six different pump spot size levels. Reiterating the conclusion drawn above, it is observed that spatial coherence γ decreases monotonically with increasing pump area or decreasing scattering mean free path. More particularly, a larger pump area or a shorter mean free path led to a more isotropic excitation volume and a greater number of lasing modes, both resulting in lower spatial coherence. Mutual configuration functions such as depicted in FIG. 4, may advantageously be utilized, according to the present disclosure, to minimize spatial coherence or to configure/tune a random laser to a desired/selected degree of spatial coherence.

Coherence was also measured as a function of the spatial distance between points on the emission spot. Experimentally, the magnification of the imaging optics was changed so that pairs of points on the emission spot with varying separation were imaged onto the double slit. The magnification was adjusted by changing the distance between the cuvette and the second spherical lens SL2 and the distance between the cylindrical lens CL and the double slit DS. The data presented in the inset of Figure was taken from the configuration with $l_s$=500 μm and d=215 μm. This corresponded to the elongated excitation volume shown in the second column of FIG. 3 and, as such, vertical interference fringes were visible at each magnification considered. Nonetheless, the coherence was seen to decrease with spatial distance. This observation is due to the finite volume of the individual lasing modes. When the spatial coherence was probed at larger separations, the intensity of a single lasing mode was less likely to be equal at the two points. This amplitude imbalance led to the reduced fringe visibility. This measurement indicates that the random laser exhibits spatial coherence over some finite area which is in general smaller than the total spot size. This "coherence area" may be a key parameter for optimizing spatial coherence for a particular imaging application (e.g., for a particular resolution). For example, a smaller coherence area may be required for reducing coherent artifacts in an imaging system having higher resolution. Depending on the parameters of a specific imaging application, a random laser may be designed to exhibit a requisite coherence area to appropriately suppress coherent artifacts.

Figure 5:
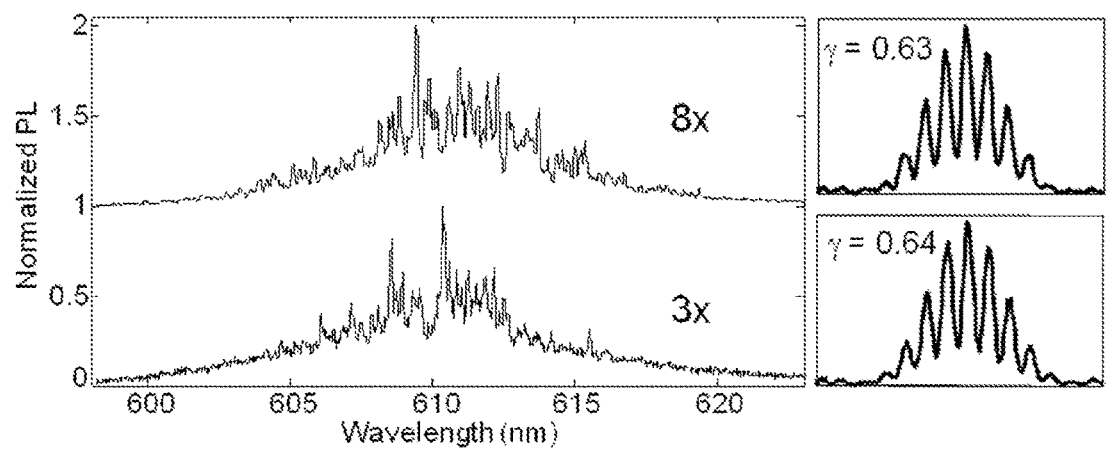
FIG. 5 depicts the effect of increasing the pump intensity on the spatial coherence of random laser emission.

With reference to FIG. 5, the effect of increasing the pump intensity on the spatial coherence of random laser emission is depicted. Interference patterns were measured from 1× to 10× the lasing threshold, but did not observe a significant change in the visibility. Further, the lasing spectra continued to exhibit discrete peaks, even at 10× threshold. Since the same lasing modes were excited the pump intensity was increased, the degree of spatial coherence remained constant. This observation is significant because it indicates that if a random laser is designed to exhibit a particular degree of spatial coherence, the spatial coherence will not depend strongly on the excitation intensity. This observation is also important in confirming that changing the spot size impacted spatial coherence due to a change in excitation volume and not due to a change in intensity/power.

Using a Coherent Laser to Mitigate Coherent Artifacts in Imaging Applications:

The present disclosure demonstrates that a complex laser configured with lower spatial coherence can used to mitigate/prevent the formation of speckle in imaging applications and produce high-quality images similar to conventional spatially incoherent sources such as an LED without the low photon degeneracy (a complex laser can have spectral radiance and photon degeneracy superior to LEDs and comparable to SLDs and broadband lasers).

To demonstrate that a low-spatial-coherence complex laser does in fact enable speckle-free imaging, images generated with random laser illumination were compared to images generated with other common light sources: a narrowband laser, a broadband laser, and an LED. An amplified spontaneous emission (ASE) source generated from the same dye solution as the random laser, only without the scattering particles was also considered. The ASE source has higher spatial coherence than the random laser, but produces a similar emission spectrum as the random laser, and it is qualitatively similar to a SLD. See, e.g., Redding, B., Choma, M. A. & Cao, H. Spatial coherence of random laser emission, Opt. Lett 36, 3404-3406 (2011).

Imaging tests were conducted in transmission mode using Köhler illumination. Images were formed using a single, aberration-corrected finite conjugate 10× objective. A Young's double slit experiment similar to the test described above with respect to FIG. 2 was conducted to characterize the spatial coherence of the sources on the object plane. The narrowband laser and the broadband laser were observed to exhibit the highest spatial coherence, followed by the ASE source. The random laser exhibits significantly lower spatial coherence than the other laser source, but not quite as low as the LED.

For the purposes of the empirical studies described in this section, the random laser (RL) included colloidal solutions of polystyrene spheres and laser dye. 5 mMol of Rhodamine 640 was dissolved in diethylene glycol. The polystyrene spheres were ~240 nm in diameter, and their scattering cross section was calculated to be $1.67 \times 10^{-11}$ cm$^2$. The sphere concentration was $6.1 \times 10^{12}$ cm$^{-3}$, yielding a scattering mean free path of ~100 μm. The ASE source was obtained from the same dye solution (5 mMol of Rhodamine 640) without polystyrene spheres. Both solutions were stored in a 1 cm×1 cm cuvette and optically excited by a frequency-doubled Nd:YAG laser ($\lambda$=532 nm) with 30 ps pulses at a repetition rate of 10 Hz. The pump beam was focused to a ~300 μm diameter spot on the front window of the cuvette. Emission from the solutions was separated from the pump beam with a dichroic mirror and then directed to the imaging experiment setup.

The narrowband laser source used was a Helium Neon gas laser operating at $\lambda$=633 nm. The broadband laser light was generated by a mode-locked Ti:Sapphire laser with 200 fs pulses at a repetition rate of 76 MHz. The Ti:Sapphire pulses at $\lambda$~790 nm produced a supercontinuum in a photonic crystal fiber and the visible component centered at ~640 nm with a bandwidth of ~40 nm was used as a broadband coherent light source. The LED used in this work was a SugarCube™ Red with a center wavelength of ~630 nm and a bandwidth of 15 nm.

The scattering films used in the imaging experiments included TiO$_2$ particles spun onto glass substrates. The particles were ~20 nm in diameter and the transport mean free path was ~600 nm. The amount of scattering was controlled by the film thickness, which was 3 μm for the experiments in FIGS. 2-4.

Finite conjugate microscope object lenses (Newport M-Series) wee used in imaging experiments. Thus, the images in FIGS. 5-7 were collected with a 10× objective lens of 0.25 numerical aperture (NA) and a cooled COHU 4920 monochrome CCD.

Figure 6:
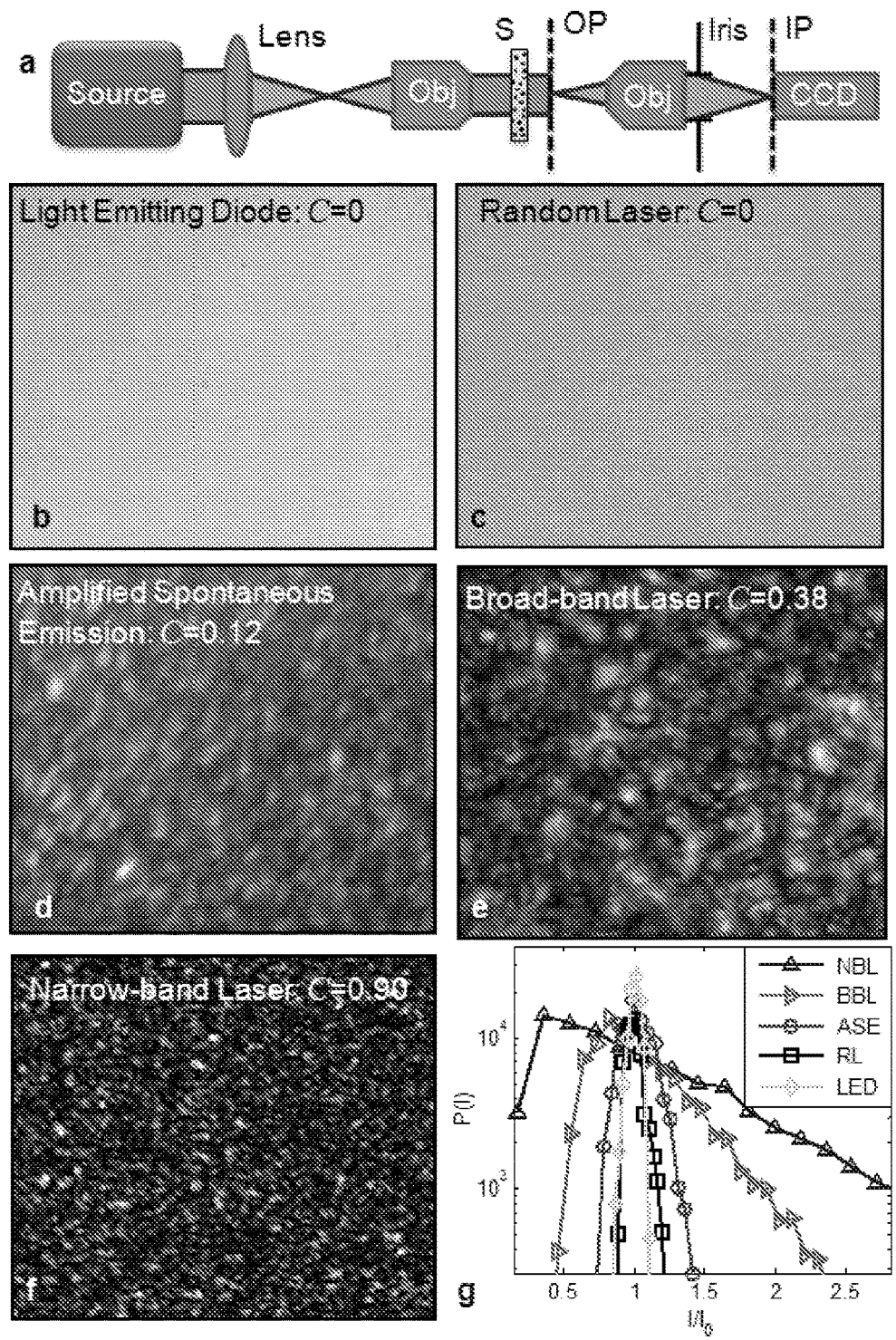
FIG. 6 depicts set-up and results for an empirical study conducted to demonstrate the ability of a various electromagnetic radiation sources to prevent speckle.

FIG. 6 (a), depicts a schematic of the experimental setup wherein each of the five light sources with different degrees of spatial coherence (the light emitting diode (LED): the random laser (RL), the amplified spontaneous emission (ASE) source, the broadband laser (BBL), and the narrowband laser (NBL) may be used to illuminate through objectives Obj. a scattering film S and wherein the image plane IP is projected onto a charge coupled device (CCD) camera.

Empirical studies were first conducted to demonstrate that the random laser (RL) can prevent speckle formation. In this experiment, there was no object in the object plane OP and light from the source passes through a scattering film S. Images taken with the five illumination sources are presented in FIG. 6 (b)-(f). Speckle is clearly visible using the narrowband laser, the broadband laser and the ASE source, while the images collected using the random laser and the LED do not exhibit any measurable speckle. As a quantitative comparison, the probability, P, was calculated for finding a pixel with a given intensity, I, normalized by the average intensity, $I_0$, of all the pixels. This probability density function is plotted in FIG. 6 (g). The relatively narrow intensity distribution under the random laser and LED illumination is contrasted with the increasingly broad distributions produced by the ASE, broadband laser, and narrowband laser. The speckle contrast (C=$\sigma_I$/<I> where $\sigma_I$ is the standard deviation of the intensity and <I> is the average intensity) was also extracted from each image and was observed to increase with the degree of spatial coherence of the source.

Figure 7:
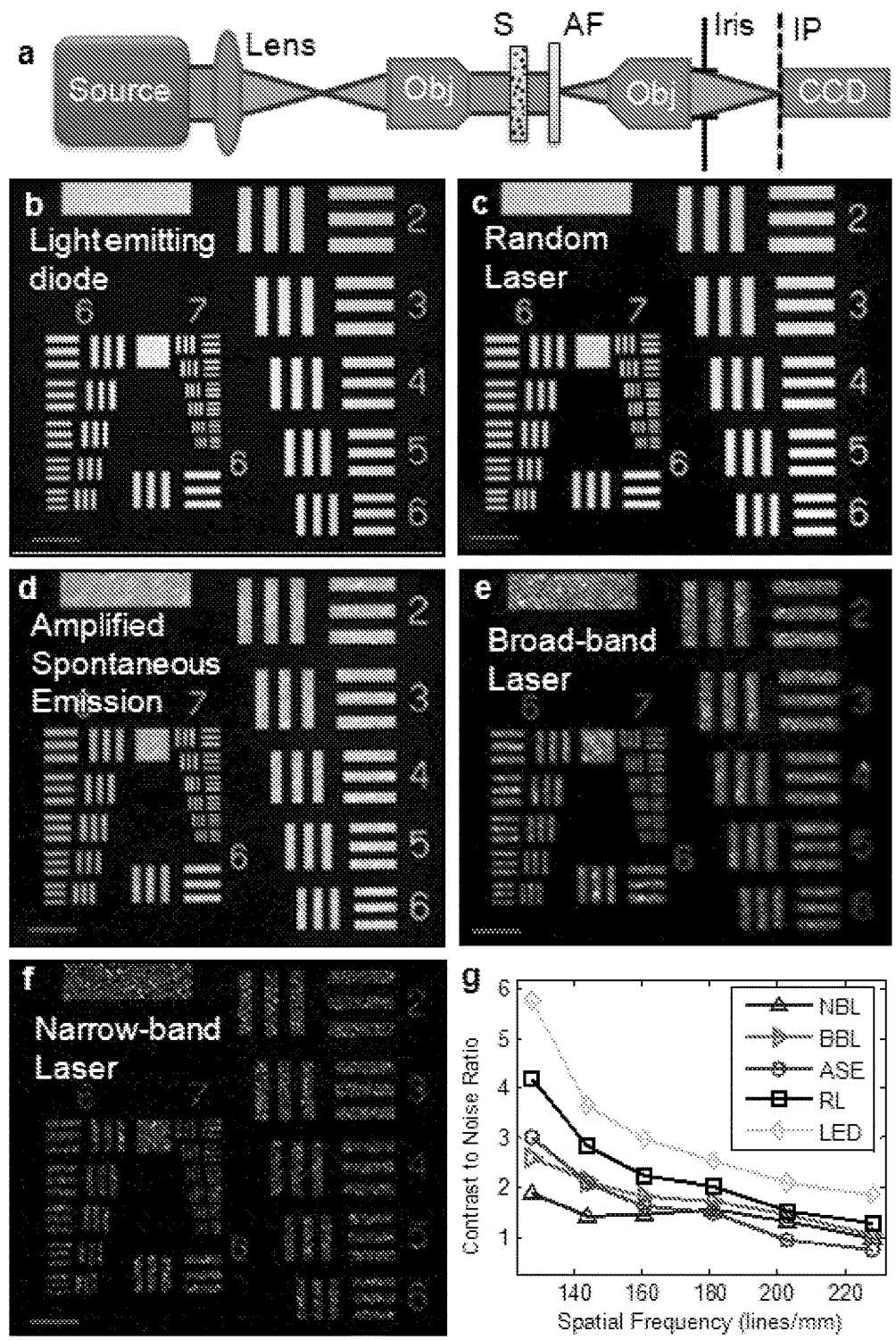
FIG. 7 depicts set-up and results for an empirical study conducted to demonstrate the ability of various electromagnetic radiation sources to improve image quality by preventing speckle.

Further empirical studies were conducted to demonstrate that ability of a random laser to prevent speckle formation translates to improved image quality. A 1951 US Air Force (AF) resolution test chart was imaged with the same five light sources. The scattering film S was placed on the illumination side of the AF chart as depicted in FIG. 7 (a) to impart random phase delays of the incident light, which resulted in speckled illumination of the object if the source has a higher degree of spatial coherence. This configuration is also equivalent to imaging an optically rough object. Images collected with the five sources are presented in FIG. 7 (b)-(f). The spatially coherent sources, particularly the narrowband laser and the broadband laser, exhibit speckle patterns within the bars of the AF chart. These artificial intensity modulations, which have no relationship with the features on the AF chart, corrupt the image. The low-spatial-coherence random laser and LED, however, eliminate interference effects and produce a clean image of the object. The image quality can be compared quantitatively by the contrast to noise ratio (CNR), which is defined as ($\langle I_f \rangle - \langle I_b \rangle$)/($\sigma_f + \sigma_b$)/2), where $\langle I_f \rangle$ is the average intensity of the feature (f) of interest (e.g. bar in the AF test chart), $\langle I_b \rangle$ is the average intensity of the surrounding background (b), and $\sigma$ is the standard deviation of pixel intensity. The CNR describes the identifiability of a feature of interest in a given background. As shown in FIG. 7 (g), the CNR decreases with increasing spatial coherence. When the CNR approaches unity, feature contrast is comparable to image noise; hence, speckle dramatically degrades the image quality at higher spatial coherence.

Figure 8:
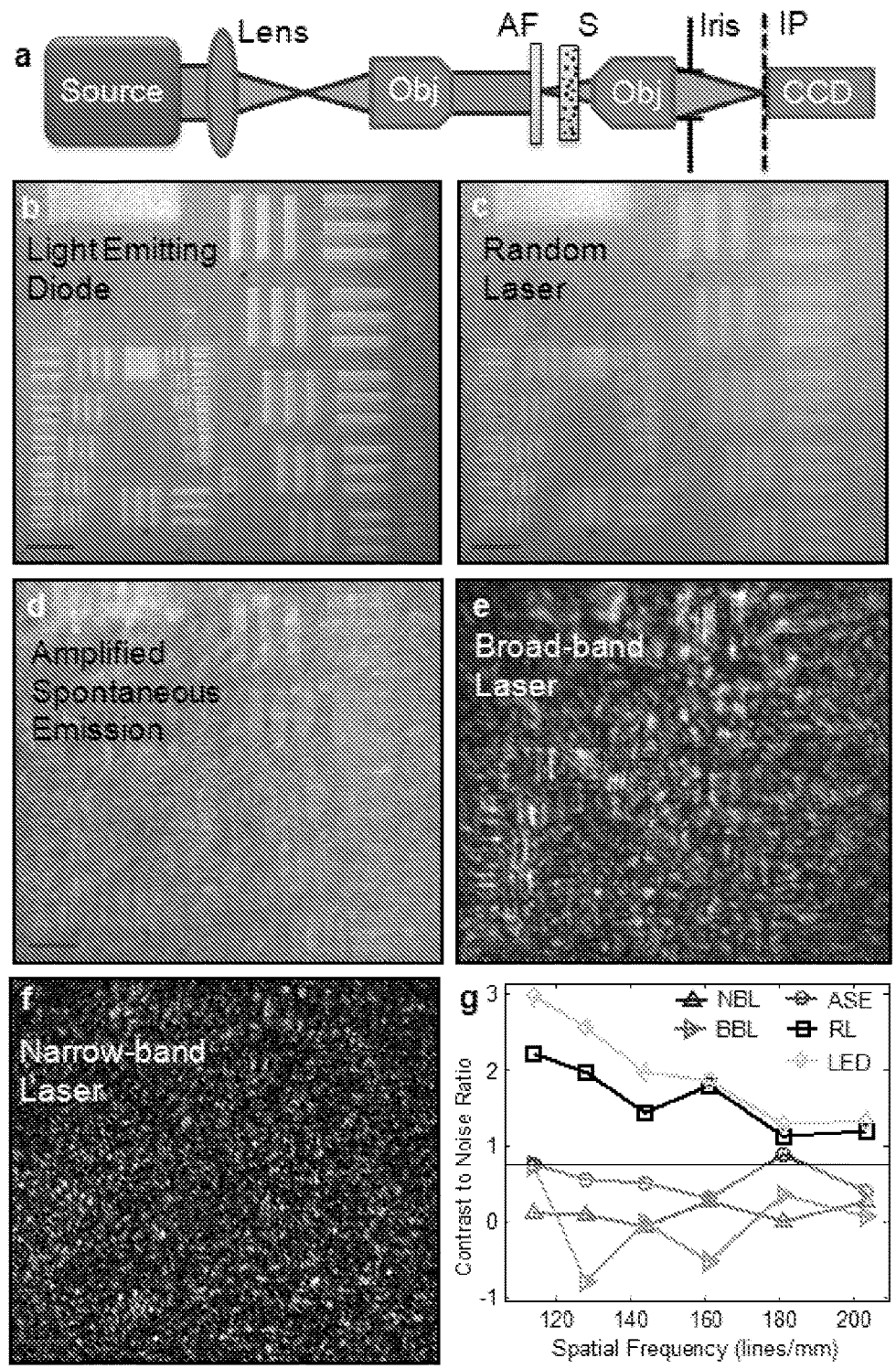
FIG. 8 depicts set-up and results for an empirical study conducted to demonstrate the ability of various electromagnetic radiation sources to improve image quality for imaging in a scattering environment.

The benefits of using a lower spatial coherence random laser were even more pronounced when imaging is performed in a scattering environment. In this case, as depicted in FIG. 8 (a) the AF test chart was imaged through the scattering film S (i.e. the scattering file S was placed on the imaging side of the AF test chart). Images collected with the five sources are shown in FIGS. 8 (b)-(f). In comparison with the images in FIG. 7 (b)-(f), the scattering film effectively increased the background signal because scattered photons were mismapped to what would otherwise be dark background regions of the image, that is, regions that correspond to opaque portions of the AF test chart. Under spatially coherent illumination, interference among these scattered photons (cross-talk) resulted in speckle that corrupts the image beyond recognition. However, when illuminating with a low-spatial-coherence source, interference among scattered photons was precluded, leading to a uniform background signal. As a result, although the scattering medium decreased the image contrast, the features of the object remained visible. Again, the CNR was estimated for each image, as shown in FIG. 8 (g). The CNRs for the conventional lasers and ASE source are below unity, consistent with previous qualitative assessments that these images contain few to no interpretable features. Only the random laser and the LED are able to produce CNRs greater than unity, which correspond to recognizable images. Therefore, the random laser can eliminate cross-talk that produces speckle.

The foregoing studies illustrate that random lasers are ideally suited for imaging in scattering environments, a common situation in biological imaging or imaging through atmospheric turbulence. The higher degree of scattering in these environments not only introduces intense cross-talk, requiring a source with lower spatial coherence, but also causes loss, requiring a source with brighter illumination than can be achieved with existing spatially incoherent sources. By meeting these two requirements, random laser sources can enable parallel (full-field) imaging in scattering environments. Furthermore, the unique ability of random lasers to provide tunable spatial coherence opens the possibility of optimizing the illumination source for a specific imaging application. The degree of spatial incoherence required to prevent speckle formation depends on the parameters of a specific imaging application (e.g. imaging numerical aperture, sample roughness). See, e.g., Kang, D. & Milster, T. D., Simulation method for non-Gaussian speckle in a partially coherent system, J. Opt. Soc. Am. A 26, 1954-1960 (2009); Kang, D. & Milster, T. D., Effect of optical aberration on Gaussian speckle in a partially coherent imaging system, J. Opt. Soc. Am. A 26, 2577-2585 (2009); and Kang, D. & Milster, T. D., Effect of fractal rough-surface Hurst exponent on speckle in imaging systems, Opt. Lett. 34, 3247-3249 (2009). As such, a random laser could be designed to provide sufficiently low spatial coherence to eliminate speckle while maintaining high photon degeneracy relative to existing spatially incoherent sources.

Figure 9:
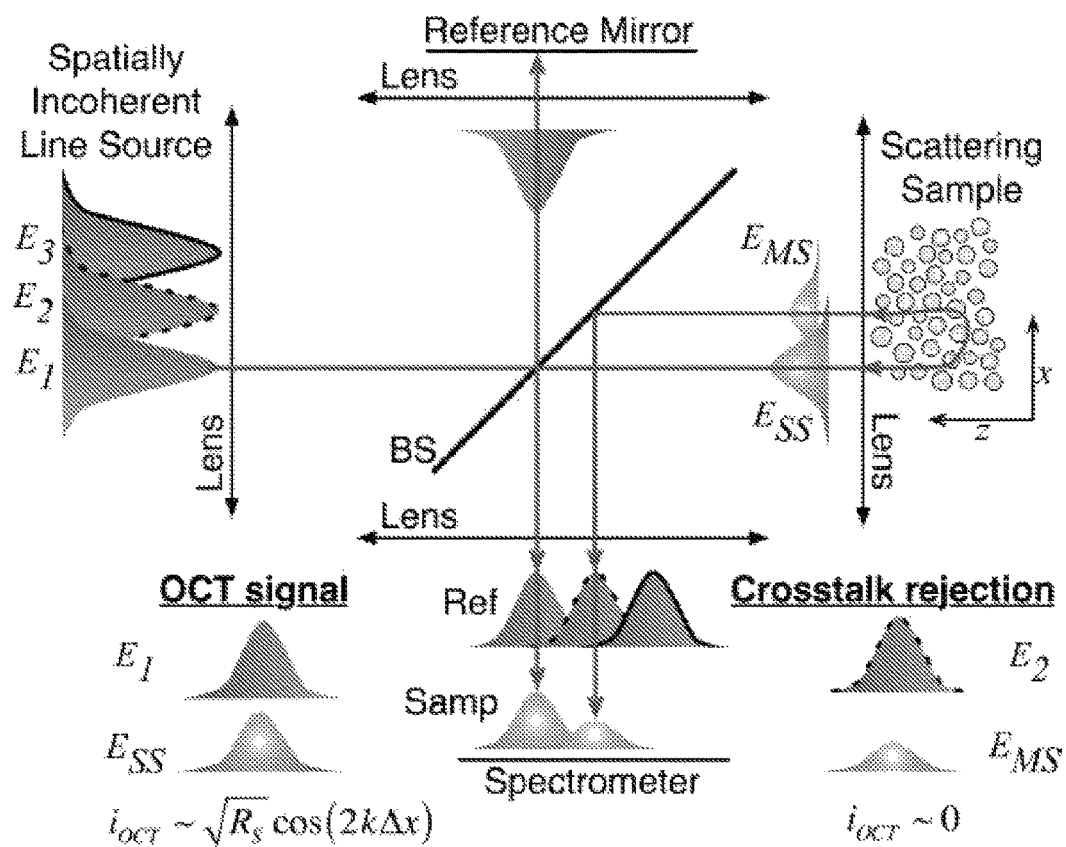
FIG. 9 illustrates how spatially incoherent light mitigates crosstalk in an exemplary optical coherence tomography (OCT) application.

FIG. 9 depicts how spatially incoherent light provides rejection of crosstalk and enforces proper mapping from the sample en face plane to one or more detectors imaging plane for an optical coherennce tomography (OCT) imaging application. Consider the path of E1, an individual spatial mode in a line source, as it travels through the interferometer. At the beamsplitter (BS), E1 travels to a fixed reference mirror and to a scattering sample. At the sample, two major signals are generated: ESS, which is generated by a single back-scatter event, and EMS, which is improperly mapped and generated by multiple scattering. When reference and sample fields interfere at an imaging spectrometer, E1 and ESS are mutually coherent and generate a useful OCT interferometric signal. However, E2 and EMS are mutually incoherent and do not generate an interferometric signal, thereby rejecting crosstalk generated by multiple scattering in the sample.

Photon Degeneracy of Random Lasers:

The photon degeneracy parameter of random lasers was estimated for comparison with conventional light sources. Note that the photon degeneracy parameter, $\delta$, is directly proportional to the spectral radiance, a radiometric measure of the amount of radiation through a unit area and into a unit solid angle within a unit frequency bandwidth. See, e.g., Mandel, L. & Wolf, E. Optical Coherence and Quantum Optics (Cambridge University Press, 1995). For a thermal source, $\delta$ depends on the temperature and is $\sim 10^{-3}$ at 4000 K. Id. A high efficiency LED has $\delta$on the order of $10^{-2}$. SLDs and broadband lasers, both exhibiting higher spatial coherence, have photon degeneracy much larger than 1. See, e.g., SugarCUBE™ Red, Nathaniel Group, Vergennes, Vt., USA. For a typical SLD, $\delta$ is estimated to be $\sim 10^3$, while a pulsed Ti:Sapphire laser has $\delta \sim 10^6$. See, e.g., Hitzenberger, C. K., Danner, M., Drexler, W. & Fercher, A. F. Measurement of the spatial coherence of superluminescent diodes, J. Modern Optics 46, 1763-1774 (1999). Narrowband lasers not only exhibit high spatial coherence, but also have long temporal coherence, leading to extremely high photon degeneracy: a typical, HeNe laser emitting 1 mW has $\delta \sim 10^9$. See, e.g., Mandel, L. & Wolf, E. Optical Coherence and Quantum Optics (Cambridge University Press, 1995). Random lasers configured with lower spatial and temporal coherence have smaller $\delta$. For the dye random laser referenced in FIG. 2, the low repetition rate of the pump laser (10 Hz) further reduces $\delta$ to $\sim 10^{-2}$. However, conventional dye lasers routinely operate at repetition rates $\sim 100$ MHz. See, e.g., Chesnoy, J. & Fini, L., Stabilization of a femtosecond dye laser synchronously pumped by a frequency-doubled mode-locked YAG laser, Opt. Lett. 11, 635-637 (1986); Knox, W. H. & Beisser, F. A., Two-wavelength synchronous generation of femtosecond pulses with 100-fs jitter, Opt. Lett. 17, 1012-1014 (1992); Johnson, A. M. & Simpson, W. M. Continuous-wave mode-locked Nd:YAG-pumped subpicosecond dye lasers, Opt. Lett. 8, 554-556 (1983); and Seifert, F. & Petrov, V. Synchronous pumping of a visible dye laser by a frequency double mode-locked Ti:sapphire laser and its application for difference frequency generation in the near infrared, Opt. Commun. 99, 413-420 (1993). Experiments were performed demonstrating that the average pump power and pulse spacing required for operation at a 1 MHz repetition rate did not adversely affect the random laser performance. Thus, it is expected that the random laser referenced in FIG. 2 can be scaled up to $\sim$MHz repetition rates producing a $\delta$ of $\sim 10^3$. This level of photon degeneracy would provide several orders of magnitude improvement compared with existing spatially incoherent sources.

Exemplary Imaging Applications:

According to the systems and methods of the present disclosure, random lasers may advantageously be used in a wide range of imaging applications. The versatility of random laser systems having the ability to control spatial coherence (as described herein) while providing laser-level intensity offers many advantages over conventional electromagnetic imaging sources.

In exemplary embodiments, random lasers with lower degrees of spatial coherence (e.g. certain random lasers) can be used in traditional incoherent imaging systems (e.g. digital light projectors, microscopy) without suffering from coherent artifacts (e.g., cross-talk and speckle). Additionally the use of a random laser is superior from the perspective of photon degeneracy to the use of a traditional non-laser light source (e.g. thermal light source [e.g. filament light bulbs], light emitting diode). Both digital light projectors and traditional microscopy are incoherent imaging applications because the image produced by the system is (ideally) a function of how some object modulates the intensity of illumination light. Coherent imaging produces images that are a function of how the object modulates the energy and phase of the illumination light.

In some ways, digital light projectors (i.e. the projectors that everyone uses now for their PowerPoint presentations and are now used in home theaters) are like traditional overhead projectors that use transparencies. Both have a light source. Both have a spatial light modulator that encodes the image information. In the case of the overhead projector, the spatial light modulator is the transparency. The transparency transmit light in a spatially- and wavelength-dependent manner (note that you could readily build an overhead projection system to work in reflective manner as opposed to a transmissive manner). In the case of a digital light projector, instead of passing through a transparency with a static mask, light is transmitted through (or reflected off of) a mask that can change its reflective or transmissive properties very quickly. It is called digital because these masks are segmented into discrete (read: digital) elements.

For both digital light projectors and overhead projectors, after the light interacts with the mask element, optics may be used to image the mask onto a screen. Digital light projectors traditionally use thermal light sources or LED light sources. There is new work using laser light sources. However, coherent artifacts (e.g. speckle) are inherent in the use of these traditional laser sources. The artifact arises because of the spatially coherent nature of the sources and because scattering (e.g. dust on lenses, screen surface roughness) and/or optical aberration (e.g. spherical aberration) is present. Reviews of these projectors complain of speckled images. Thus, in exemplary embodiments, a random laser system with high degeneracy and lower spatial coherence may be used to mitigate such artifacts in projector applications.

A traditional microscope (e.g. upright, inverted, stereo-microscope with full-field illumination) is very similar in concept to a projector except that the (reflective or transmissive) mask is replaced with a specimen. While the various optics after the specimen (mask) may be a little different, but the end goal is the same: to generate a magnified version of the specimen (mask) onto a screen or detector (e.g. camera). Microscopes suffer from coherent artifacts when illuminated with a conventional laser (or any spatially coherent light source) because scattering (e.g. dust on lenses, screen surface roughness) and/or optical aberration (e.g. spherical aberration) is present. Thus, in exemplary embodiments, a random laser system with higher degeneracy and lower spatial coherence may be used to mitigate such artifacts in microscopy applications.

In addition to lower spatial coherence, random lasers can exhibit low temporal coherence. For example, the temporal coherence length of the dye random laser described herein can be estimated from the emission bandwidth to be ~17 µm. This short temporal coherence allows use of random lasers in coherent imaging applications such as optical coherence tomography (OCT) and holography which are known to suffer from spatial coherence induced artifacts.

Optical coherence tomography is known to suffer from cross-talk, degrading the image quality, when illuminated with a spatially coherent light source. Conventional spatially incoherent sources, however, (i.e. white light sources) are too weak for many OCT applications. A random laser combines the merits of both by providing intense, spatially incoherent illumination. By adjusting the mean free path between scattering elements and the excitation volume, one is able to control the spatial coherence of a random laser emission. This enables one to utilize an optimally configure random laser to design an intense, spatially incoherent illumination source to mitigate cross talk in OCT.

Figure 10:
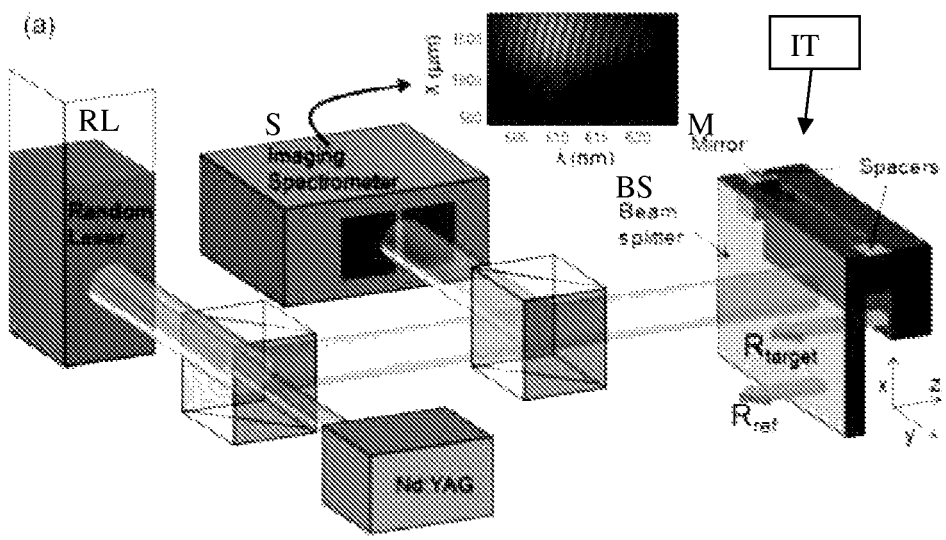
FIG. 10 depicts a schematic of an exemplary common path OCT using a random laser and performance results thereof.
Figure 10:
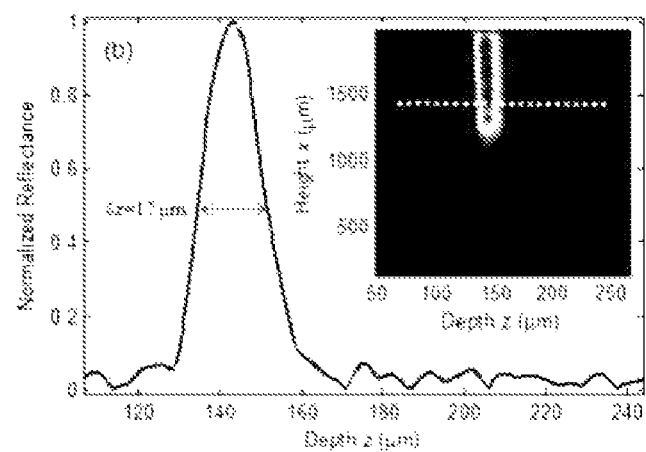
Figure 10:
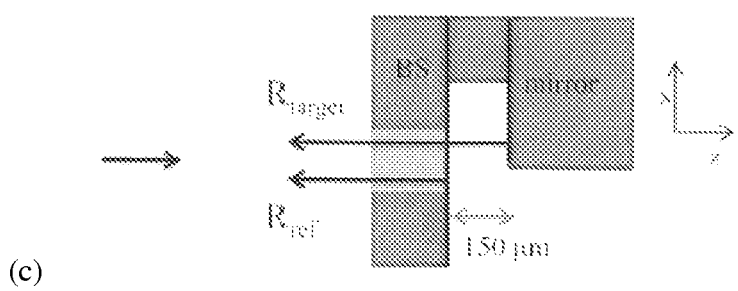

To demonstrate the utility of a random laser for full-field OCT a schematic of an exemplary common path OCT using a random laser is depicted in FIG. 10 (a) (FIG. 10 (c) depicts a close-up of the common path imaging target IT). Spatially incoherent stimulated emission from the random laser RL is redirected to an imaging target T including a beam splitter BS and a mirror M, separated by a 150 µm cover slip. The reflective side of the beam splitter BS is closer to the mirror M and provides the reference reflection while the mirror produces the target reflection. The interference signal is measured with an imaging spectrometer S, maintaining the spatial information in the vertical direction while encoding the depth information in the spectral domain. Using a Fourier transform on the spectrometer image, an x-z image of the target may be obtained, as shown in FIG. 10 (b). In test studies, the cross section of the mirror M along the z-axis revealed an axial resolution of 17 matching up well with the expected resolution based on the ~10 nm bandwidth of the random laser emission (expected resolution of $\delta z = 0.44 \lambda^2 / \Delta \lambda = 16$ µm). Thus, in exemplary embodiments, a random laser system with higher degeneracy and lower spatial coherence may be used to mitigate artifacts in OCT applications.

In exemplary embodiments, a complex laser with tunable spatial coherence may be used to image a sample using illumination with different degrees of spatial coherence. The data may then be combined, e.g., to produce a single image. For example, a first image may be captured using a first degree of spatially coherent illumination (e.g., a higher degree of spatial coherence) and a second image may be captured using a second degree of spatially coherent illumination (e.g., a lower degree of spatial coherence). The first and second images may then be processed and combined. For example, images captured using illumination with different degrees of spatial coherence may be compared, e.g., to determine sectioning and/or segmentation information for the sample (e.g., similar to confocal microscopy-like sectioning). Alternatively, images captured using illumination with different degrees of spatial coherence may be separately processed for different types of information. For example, images captured using illumination with a higher degree of spatial coherence may analyzed to obtain speckle information which can contain information related scattering properties of the sample and/or to movement in the sample, e.g., flow, shear, velocity, etc. Images captured using illumination with a lower degree of spatial coherence, on the other hand, may be used to produce speckle-free image(s) of a sample structure. Separately determined information may be later be combined, e.g., to produce maps of scattering properties of the sample or maps of motion in the sample. Advantageously, the systems and methods of the present disclosure enable imaging using a single source to produce illumination with varying degrees of spatial coherence.

Although the present disclosure has been described with reference to exemplary embodiments and implementations thereof, the disclosed systems, and methods are not limited to such exemplary embodiments/implementations. Rather, as will be readily apparent to persons skilled in the art from the description provided herein, the disclosed apparatus, systems and methods are susceptible to modifications, alterations and enhancements without departing from the spirit or scope of the present disclosure. Accordingly, the present disclosure expressly encompasses such modification, alterations and enhancements within the scope hereof.

What is claimed:

1. An active interrogation imaging system, the imaging system comprising:
a complex laser having a mutual coherence of less than one tenth and a photon degeneracy of greater than $10^2$ that produces a plurality of independent lasing modes with uncorrelated phase relationships and distinct spatial output patterns in response to being pumped; and
one or more detectors that detect an image of an object in response to interrogation of the object by the plurality of independent lasing modes with distinct spatial output patterns,
wherein the plurality of independent lasing modes with distinct spatial output patterns of the complex laser in response to being pumped has a controlled degree of spatial coherence and the image detected by the one or more detectors in response to the controlled degree of spatial coherence is free of speckle,
wherein the complex laser is adapted to enable (i) adjusting a mean free path by adjusting a refractive index of at least one of (1) a background material in an excitation medium or (2) scattering elements in an excitation medium or (ii) adjusting of a shape of the cavity to adjust a degree of cavity chaoticity.

2. The system of claim 1, wherein the plurality of lasing modes output by the complex laser mitigates cross-talk.

3. The system of claim 1, wherein the complex laser is configured based on a pre-selected degree of spatial coherence such that generated electromagnetic radiation exhibits the pre-selected degree of spatial coherence.

4. The system of claim 1, wherein the complex laser is adapted to enable adjusting of one or more of the following: (i) the generated electromagnetic radiation's degree of spatial coherence; (ii) a mean free path for photons in an excitation medium; (iii) a concentration of scattering elements in an excitation medium; (iv) size of scattering elements in an excitation medium, (v) shape of scattering elements in an excitation medium, and (vi) placement of scattering elements in an excitation medium.

5. The system of claim 1, wherein the imaging system is selected from the group consisting of (i) an incoherent imaging system, (ii) a coherent imaging system; (iii) a coherent ranging imaging system; (iv) an optical coherence tomography system; and (v) a holographic imaging system.

6. The system of claim 1, wherein the complex laser comprises a cavity having different sections that are selectively pumped to control the degree of spatial coherence.

7. The system of claim 1, further comprising an excitation medium that is translatable with respect to a pump beam to control an excitation volume of the complex laser.

8. A complex laser with tunable spatial coherence in an imaging system, comprising:
an excitation medium; and
an excitation source for pumping the excitation medium, wherein the complex laser is a chaotic cavity laser having a cavity and is adapted to be reconfigured by (i) adjusting the mean free path through adjusting a refractive index of at least one of (1) a background material in the excitation medium or (2) scattering elements in the excitation medium or (ii) adjusting of a shape of the cavity to adjust a degree of cavity chaoticity to form a speckle-free image of an object in response to an interaction of electromagnetic radiation generated by the complex laser and the object,
wherein the complex laser has a mutual coherence of less than one tenth and a photon degeneracy of greater than $10^2$.

9. The complex laser of claim 8, wherein the complex laser is adapted to enable adjusting of one or more of the following: (i) the generated electromagnetic radiation's degree of spatial coherence; (ii) a mean free path for photons in an excitation medium; (iii) a concentration of scattering elements in an excitation medium; (iv) size of scattering elements in an excitation medium, (v) shape of scattering elements in an excitation medium, (vi) placement of scattering elements in an excitation medium; (vii) a refractive index of a background material in an excitation medium; and (viii) a refractive index of scattering elements in an excitation medium.

10. A method for suppressing coherent artifacts in an image of an object, the method comprising reconfiguring a complex laser of an imaging system to suppress coherent artifacts in an image of an object generated in response to an interaction of electromagnetic radiation generated by the complex laser and the object by at least one of (i) adjusting an excitation volume of an excitation medium and (ii) adjusting a mean free path for photons in an excitation medium by adjusting a refractive index of at least one of (1) a background material in the excitation medium or (2) scattering elements in the excitation medium, the complex laser being a chaotic cavity laser having a cavity, a mutual coherence of less than one tenth, and a photon degeneracy of greater than $10^2$,
wherein reconfiguring the complex laser adjusts a degree of cavity chaoticity by adjusting the shape of the cavity to control a degree of spatial coherence of the complex laser and the image generated in response to the controlled degree of spatial coherence is free of speckle.

11. The method of claim 10, wherein the reconfiguring the complex laser includes adjusting the excitation volume, wherein the adjusting the excitation volume includes adjusting a pump spot size of an excitation source on the excitation medium.

12. The method of claim 10, wherein the reconfiguring the complex laser includes adjusting the excitation volume, wherein the adjusting the excitation volume includes adjusting a size of an electrode excitation region of the excitation medium.

13. The method of claim 10, wherein the reconfiguring the complex laser includes adjusting the mean free path, wherein the adjusting the mean free path includes adjusting a concentration of scattering elements in the excitation medium.

14. The method of claim 10, wherein the reconfiguring the complex laser includes adjusting the mean free path, wherein the adjusting the mean free path includes adjusting at least one of (i) size, (ii) shape and (iii) placement of scattering elements in the excitation medium.

15. The method of claim 10, wherein reconfiguring the complex laser of the imaging system to suppress coherent artifacts in the image of the object includes adjusting the excitation volume of the excitation medium and adjusting the mean free path for photons in the excitation medium.

16. The method of claim 10, wherein the complex laser includes one of a random laser, a partially ordered laser, or a chaotic cavity laser.

17. The method of claim 10, further comprising increasing the excitation volume to increase a quantity of lasing modes.

18. The method of claim 10, wherein adjusting the excitation volume tunes a spatial coherence of the laser and the method further comprises:
   illuminating the object with the laser tuned to different degrees of spatial coherence;
   capturing images of the object in response to being illuminated by the laser at each of the different degrees of illumination; and
   combining the images to produce a single image.

19. The method of claim 18, wherein adjusting the excitation volume tunes a spatial coherence of the laser and the method further comprises:
   capturing a first image of a sample using a first degree of spatial coherence;
   capturing a second image of the sample using a second degree of spatial coherence; and
   combining the first and second images to produce a single image.

20. The method of claim 18, wherein adjusting the excitation volume tunes a spatial coherence of the laser and the method further comprises:
   capturing a first image of a sample using a first degree of spatial coherence; and
   capturing a second image of the sample using a second degree of spatial coherence,
   wherein the first degree of spatial coherence is less than the second degree of spatial coherence.

21. The method of claim 20, further comprising:
   producing maps of scattering properties based on the first and second images.

22. An active interrogation imaging system, the imaging system comprising:
   a complex laser having a mutual coherence of less than one tenth and a photon degeneracy of greater than $10^2$ that produces a plurality of independent lasing modes with uncorrelated phase relationships and distinct spatial output patterns in response to being pumped; and
   one or more detectors that detect an image of an object in response to interrogation of the object by the plurality of independent lasing modes with distinct spatial output patterns,
   wherein the plurality of independent lasing modes with distinct spatial output patterns of the complex laser in response to being pumped has a controlled degree of spatial coherence and the image detected by the one or more detectors in response to the controlled degree of spatial coherence is free of speckle,
   wherein the complex laser is adapted to enable (i) adjusting a mean free path by adjusting a concentration of scattering elements in an excitation medium and (ii) adjusting of a shape of the cavity to adjust a degree of cavity chaoticity.

* * * * *